United States Patent [19]

Aronowitz et al.

[11] Patent Number: 5,298,435

[45] Date of Patent: Mar. 29, 1994

[54] APPLICATION OF ELECTRONIC PROPERTIES OF GERMANIUM TO INHIBIT N-TYPE OR P-TYPE DIFFUSION IN SILICON

[75] Inventors: Sheldon Aronowitz, San Jose; Courtney L. Hart, Los Gatos; Sung T. Ahn, Albany, all of Calif.

[73] Assignee: National Semiconductor Corporation, Santa Clara, Calif.

[21] Appl. No.: 939,982

[22] Filed: Sep. 3, 1992

Related U.S. Application Data

[60] Division of Ser. No. 738,798, Jul. 31, 1991, Pat. No. 5,280,185, which is a continuation-in-part of Ser. No. 510,742, Apr. 18, 1990, Pat. No. 5,095,358.

[51] Int. Cl.$^5$ .......................................... H01L 21/265
[52] U.S. Cl. ........................................ 437/24; 437/154; 437/959; 437/976
[58] Field of Search ................. 437/24, 150, 153, 154, 437/951, 959, 976; 148/DIG. 40, DIG. 58, DIG. 59, DIG. 157

[56] References Cited

U.S. PATENT DOCUMENTS

| | | | |
|---|---|---|---|
| 3,725,145 | 4/1973 | Maki | 437/959 |
| 3,783,050 | 1/1974 | Nanba et al. | 437/976 |
| 4,111,719 | 9/1978 | Mader et al. | 437/976 |
| 4,603,471 | 8/1986 | Strain | 437/24 |
| 4,728,619 | 3/1988 | Pfiester et al. | 437/29 |
| 4,835,112 | 5/1989 | Pfiester et al. | 437/24 |

Primary Examiner—Tom Thomas
Assistant Examiner—C. Chaudhari
Attorney, Agent, or Firm—Limbach & Limbach

[57] ABSTRACT

A method of inhibiting dopant diffusion in silicon using germanium is provided. Germanium is distributed in substitutional sites in a silicon lattice to form two regions of germanium interposed between a region where dopant is to be introduced and a region from which dopant is to be excluded, the two germanium regions acting as a dopant diffusion barrier.

15 Claims, 10 Drawing Sheets

APPLICATION OF ELECTRONIC PROPERTIES OF GERMANIUM TO INHIBIT N-TYPE OR P-TYPE DIFFUSION IN SILICON

RELATED APPLICATIONS

This is a divisional of application Ser. No. 07/738,798, filed Jul. 31, 1991, now U.S. Pat. No. 5,280,185, which is a continuation-in-part of U.S. Ser. No. 07/510,742, Filed Apr.18, 1990 (U.S. Pat. No. 5,095,358, issued Mar. 10, 1992).

BACKGROUND OF THE INVENTION

1. Field of the Invention

The present invention relates generally to fabrication of semiconductor integrated circuits and, in particular, to use of germanium in substitutional sites in a crystalline silicon lattice as a diffusion barrier for both n-type and p-type dopant species.

2. Discussion of the Prior Art

The technology of semiconductor integrated circuits is based upon controlling electric charge in the surface region of the semiconductor material used as the starting substrate for the circuits. In the vast majority of integrated circuits manufactured today, the semiconductor substrate is pure crystalline silicon.

Since a silicon crystal structure consists of a regular pattern of silicon atoms, its atomic arrangement can be described by specifying silicon atom positions in a repeating unit of the silicon lattice.

Figure 1:
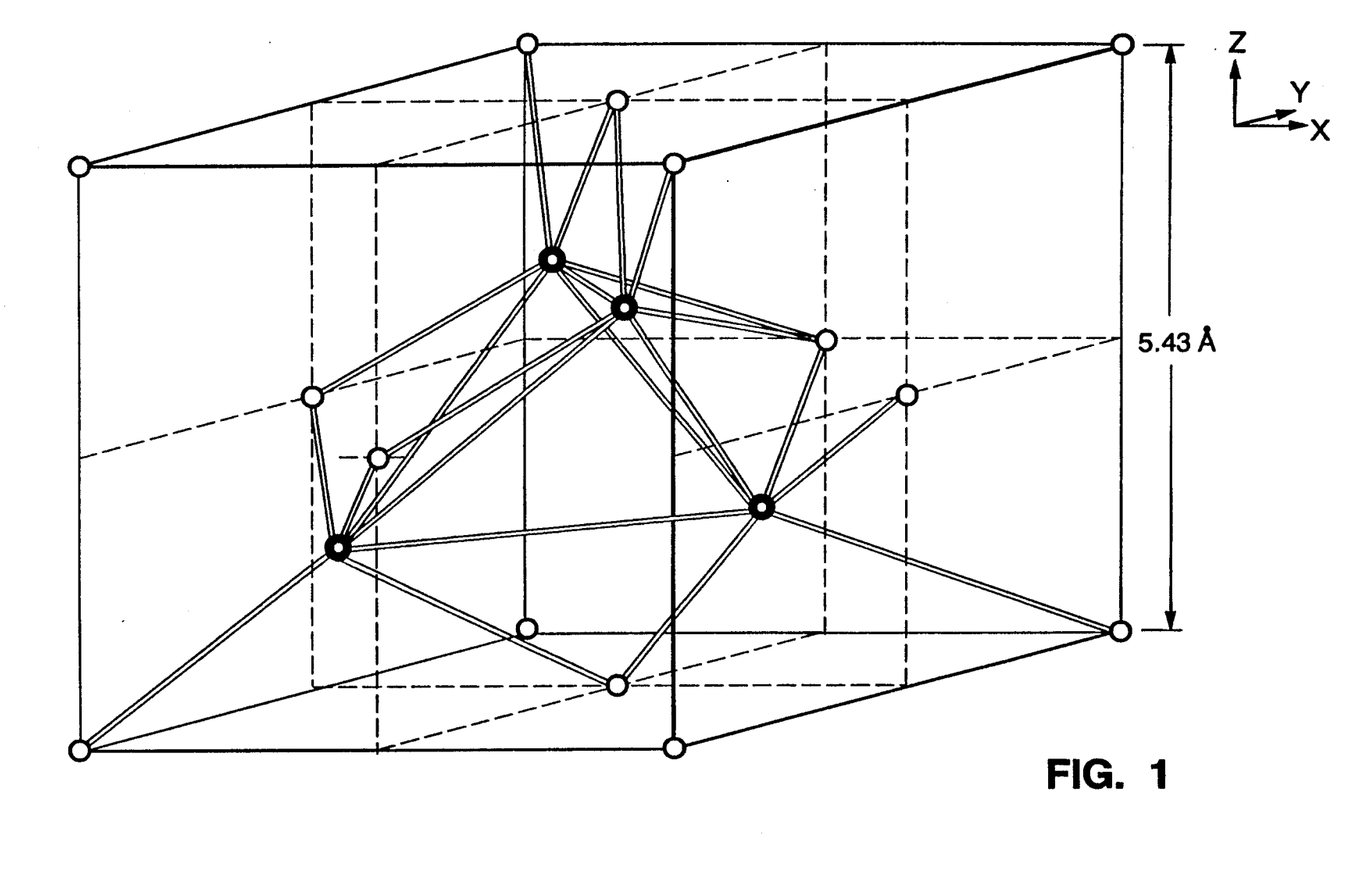
FIG. 1 illustrates a model silicon diamond cubic crystal structure.

FIG. 1 shows the cubic unit "cell" of crystalline silicon, identifying eight corner silicon atoms (C), eight exterior face silicon atoms (F) and four interior silicon atoms (I). It can be seen from FIG. 1 that if a given silicon atom is considered as being at the center of a box, then that silicon atom is bonded to four neighboring silicon atoms that define the four vertices of an equilateral pyramid. Five silicon atoms in the upper front corner of the FIG. 1 unit cell are accentuated to illustrate the basic building block. This building block may then be used to construct the cubic cell shown in FIG. 1, the so-called diamond cubic crystal structure.

The silicon diamond cubic crystal structure shown in FIG. 1 has the property that it may be repeated in three mutually perpendicular directions to generate a silicon crystal of the desired size.

It also has the property that it may be represented by closely-packed planes of atomic spheres stacked one on top of another to maximize density. A packing arrangement of this type results in the definition of both tetrahedral combinations of spheres and octahedral combinations of spheres. A closely-packed, repetitive array of tetrahedra contains octahedral interstitial spaces between the tetrahedra. Similarly, a closely-packed, repetitive array of octahedral contains tetrahedral interstitial spaces. Thus, a crystalline silicon lattice is said to include both tetrahedral and octahedral interstitial sites.

Control of electric charge in the surface region of crystalline silicon used for fabricating integrated circuits is achieved by introducing impurity or "dopant" atoms into the silicon lattice. Depending on the desired electrical characteristics, the dopant may be either "n-type" or "p-type."

When a dopant is introduced that has five valence electrons, i.e., one more valence electron than silicon, an extra electron is provided that does not fit into the bonding scheme of the silicon lattice. This extra electron can be used to conduct current. The "n-type" dopant atoms (e.g. phosphorous (P), arsenic (As) and antimony (Sb)), are called donors because, as Group V elements, they possess this extra electron. The "n" denotes negative and is used to represent the surplus of negative charge carriers available in the silicon lattice with the dopant present.

When a dopant is introduced that has only three valence electrons, a place exists in the silicon lattice for a fourth electron. This "p-type" dopant (such as boron) is called an acceptor. The "p" denotes positive and represents the surplus of "holes", or positive charge carriers, that exists in the lattice.

In the fabrication of integrated circuits, dopants are often introduced to the silicon lattice by diffusion. Diffusion is the mechanism by which different sets of particles confined to the same volume tend to spread out and redistribute themselves evenly throughout the confined volume. In the case of integrated circuits, the diffusion process results in movement and distribution of dopant atoms in the crystalline silicon lattice. In crystalline solids, diffusion is significant only at elevated temperatures where the thermal energy of the individual lattice atoms becomes great enough to overcome the interatomic forces that hold the lattice together.

In crystalline silicon, dopants diffuse through the lattice by one of two diffusion mechanisms substitutional diffusion or interstitial diffusion, or by a combination of the two. By substitutional diffusion, the dopant atoms move through the lattice by replacing a silicon atom at a given lattice site. By interstitial diffusion, the dopant atoms move via the tetrahedral or octahedral interstitial sites in the lattice structure.

According to Fick's first law, particles tend to diffuse from a region of high concentration to a region of lower concentration at a rate proportional to the concentration gradient between the two regions. This can be mathematically expressed as:

$$F = -D\frac{\delta N}{\delta x}$$

where F is the net particle flux density, N is the number of particles per unit volume, and x is the distance measured parallel to the direction of flow; D is the diffusion coefficient, which is a property of the particular dopant and is an exponential function of temperature.

Fast diffusing dopant species, i.e., dopants having a high diffusion coefficient, such as phosphorous (n-type) and boron (p-type), are difficult to control within the crystalline silicon lattice. Thus, when these dopants are used, shallow diffusion region junctions and the lateral containment necessary for isolation of diffused dopant regions are difficult to achieve.

Both Meyers et al, "Ge+ preamorphization of silicon: effects of dose and very low temperature thermal treatments on extended defect formation during subsequent SPE", Proc. Mat. Res. Soc., 52, 107 (1986), and Sadana et al, "Germanium implantation into silicon: an alternative preamorphization rapid thermal annealing procedure for shallow junction formation", Proc. Mat. Res. Soc., 23. 303 (1984), have reported the use of germanium for preamorphizing silicon to reduce dopant diffusion. According to this technique, germanium atoms are introduced into the silicon lattice to destroy crystallinity in the area of introduction. Then, the active dopant species is introduced into the preamorphized area. The structure is then subjected to a high temperature annealing procedure which results in the creation of the desired dopant regions in a reconstructed crystalline lattice having germanium atoms at substitutional sites. The purpose of the preamorphitation is to minimize dopant channeling in the creation of the dopant regions.

Germanium is chosen as the preamorphizing agent because of its unlimited solid-solubility in silicon. Furthermore, as a member of the same group as silicon, germanium does not change the electronic configuration of the silicon lattice. It also has been found that the damage sites in the silicon lattice introduced by germanium act as gettering centers.

While the germanium preamorphization procedure reduces the damage caused to the silicon lattice in the formation of diffused dopant regions, it has little effect on the dopant diffusion control problems mentioned above.

SUMMARY OF THE INVENTION

The present invention provides a method for inhibiting dopant diffusion in silicon using germanium. In accordance with the method, high concentrations of germanium are introduced into substitutional sites in a silicon lattice. These germanium-rich substitutional regions attract interstitial Group III or Group V dopants. Attraction for Group V dopants continues when these n-type dopants are substitutional. Group III substitutional dopants, however, are repelled from regions of high germanium concentration. This interactive behavior, along with the other properties of germanium in silicon, is used to create diffusion barriers useful for both n-type and p-type dopant species.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

Our model calculations have established that high concentrations of germanium introduced into substitutional sites in crystalline silicon will attract interstitial Group III (boron, aluminum) or Group V (arsenic, phosphorous) dopants. Attraction for the Group V dopants continues when these n-type dopants are substitutional. Group III substitutional dopants, however, are repelled from regions of high germanium concentration.

Figure 2:
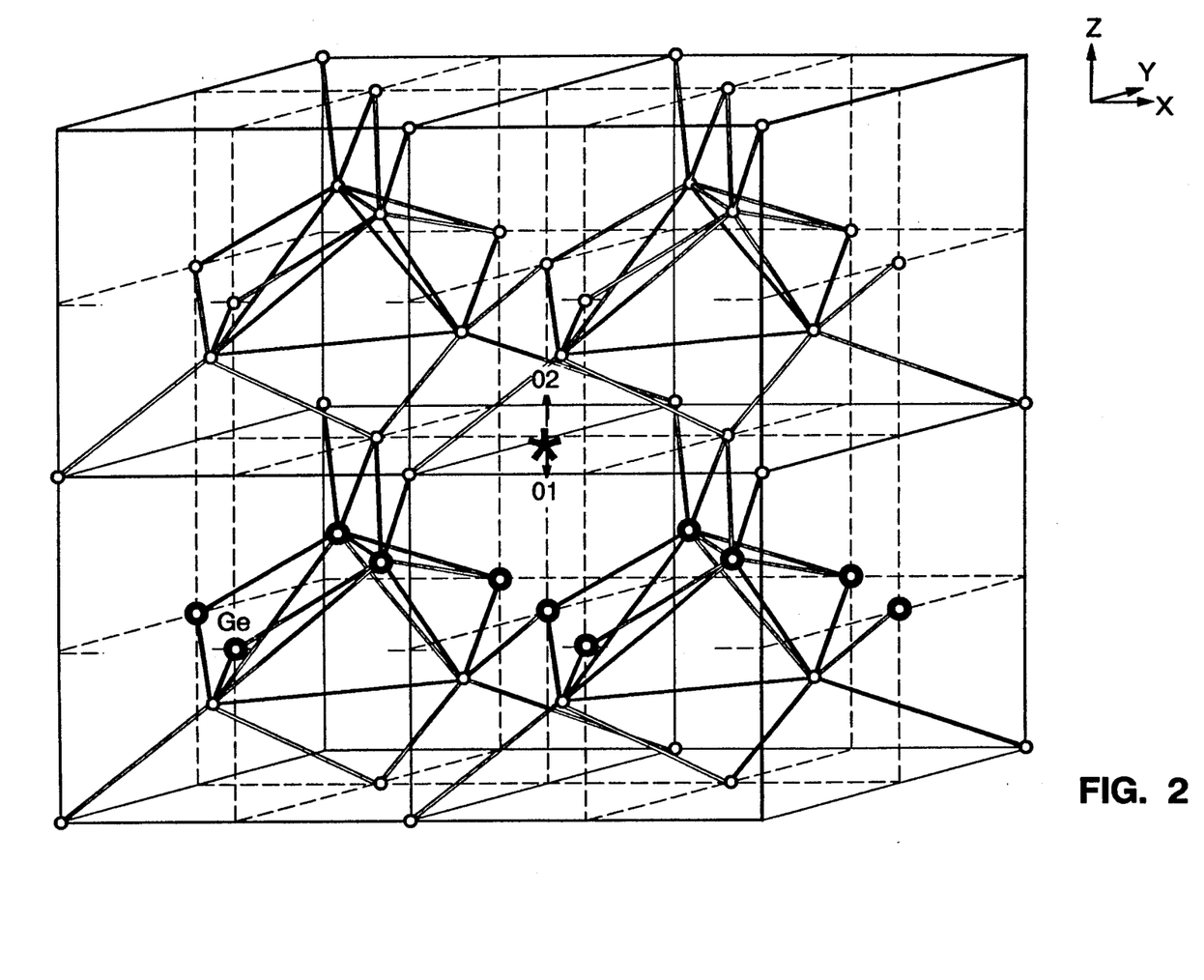
FIG. 2 illustrates a model silicon lattice with substitutional germanium atoms and defining two octahedral interstitial positions 01 and 02.

FIG. 2 illustrates a model <100> silicon lattice with germanium atoms replacing some of the silicon atoms. The large darkened circles in FIG. 1 represent the germanium atoms, identified by the label "Ge"..All germanium atoms in the FIG. 1 model occupy substitutional sites. Calculations were done assuming one of the two octahedral interstitial dopant positions, labelled "01" and "02" in FIG. 2, occupied by either an n-type (Group V) or a p-type (Group III) dopant atom. The "01" position is closer to the germanium-rich region. The calculated relative energies of dopants occupying the 01 and 02 interstitial positions are provided in Table I below.

Figure 3:
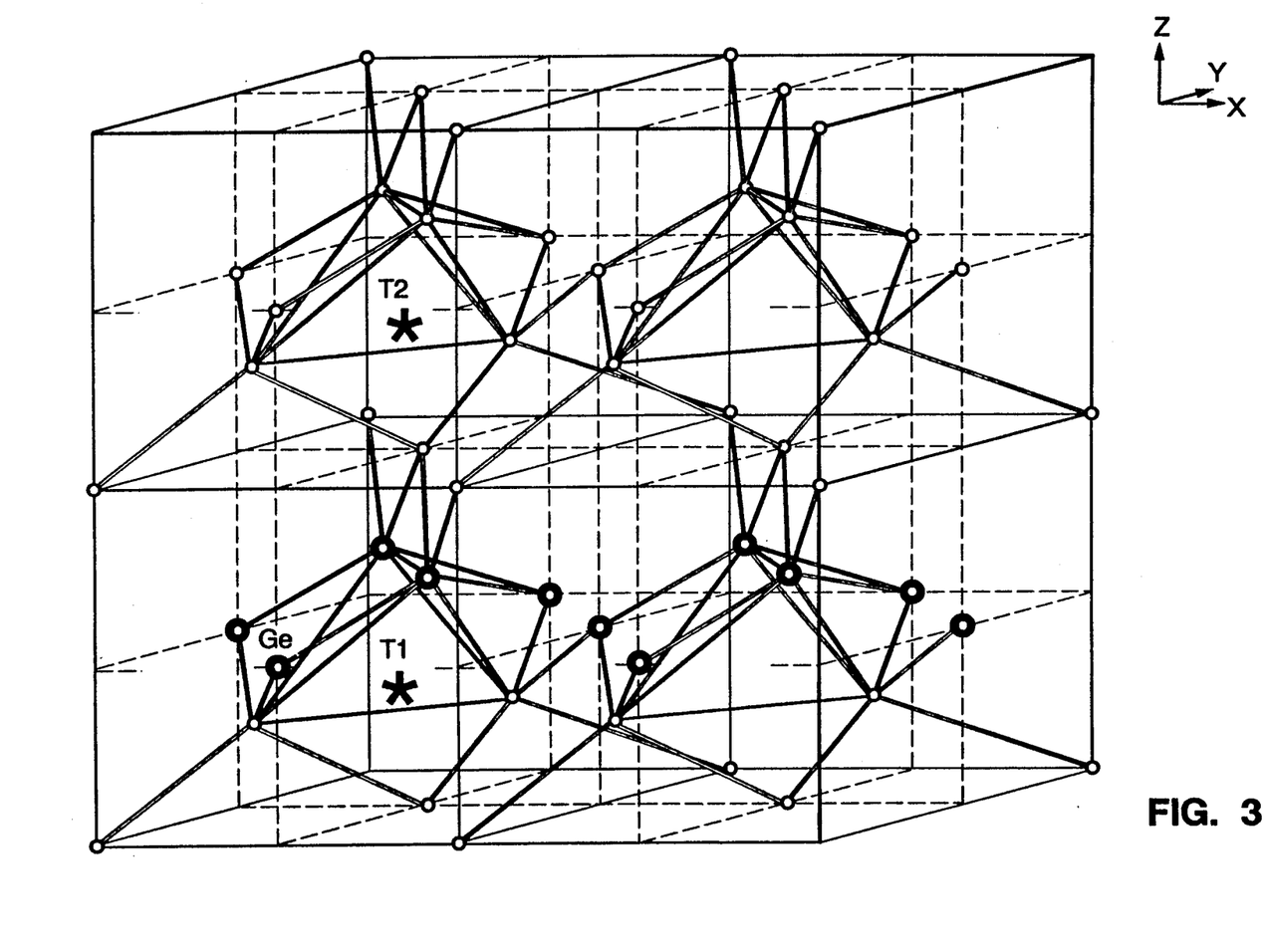
FIG. 3 illustrates a model silicon lattice with substitutional germanium atoms and defining two tetrahedral interstitial positions T1 and T2.

FIG. 3 shows a model <100> silicon lattice with substitutional germanium atoms and defining two tetrahedral interstitial dopant positions, labelled "T1" and "T2". The "T1" position is closer to the germanium-rich region. Calculations were done assuming one of the tetrahedral sites T1 or T2 occupied either by an n-type or a p-type dopant atom. The calculated relative energies of dopants occupying the T1 and T2 tetrahedral positions are provided in Table I below.

Figure 4:
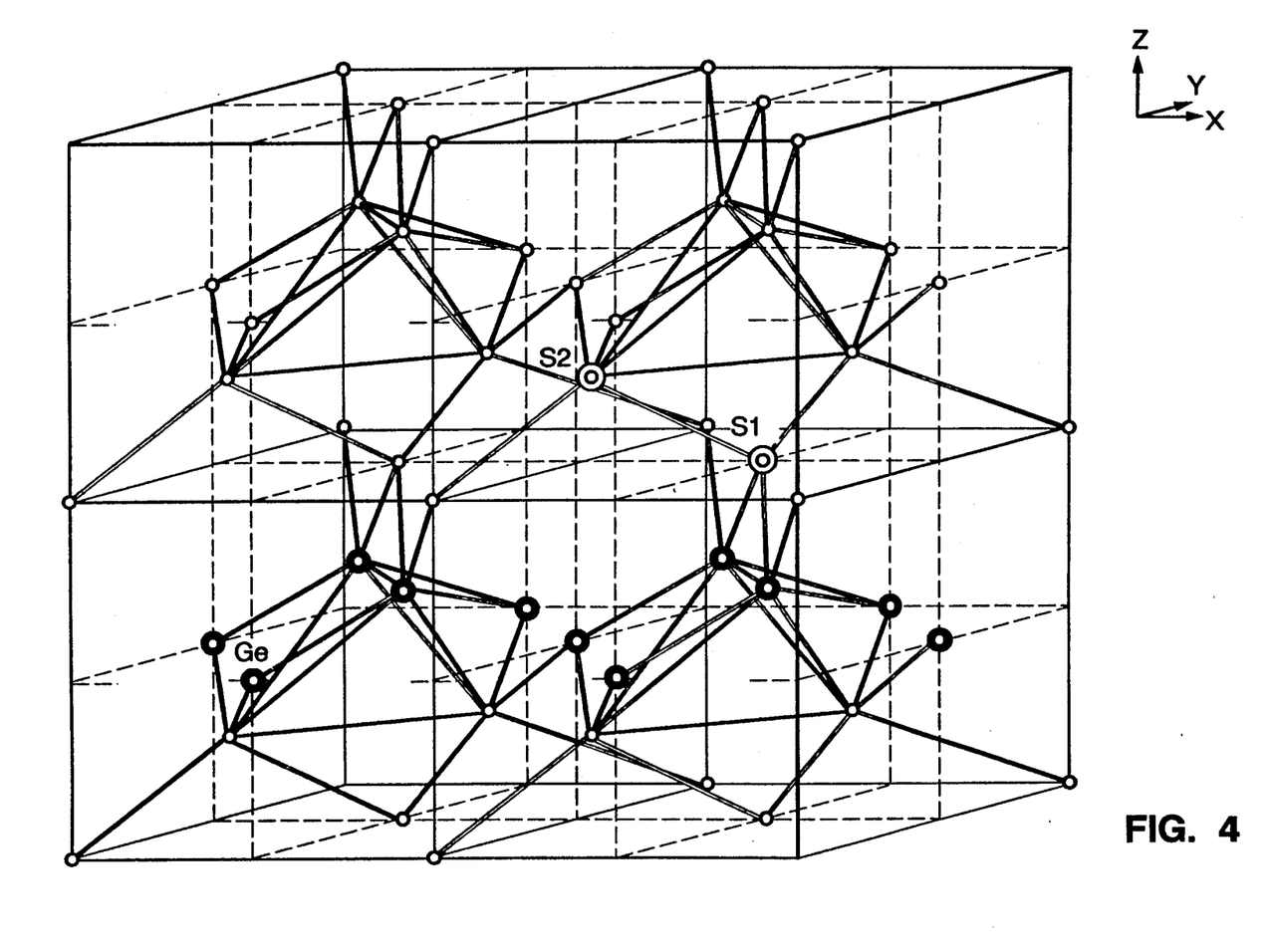
FIG. 4 illustrates a model silicon lattice with substitutional germanium atoms and defining two substitutional sites S1 and S2.

FIG. 4 shows a model <100> silicon lattice with substitutional germanium and defining two substitutional dopant sites, labelled "S1" and "S2". Calculations were done With a n-type or a p-type dopant occupying one of these two sites. The calculated relative energies of dopants occupying the S1 and S2 substitutional sites are provided in Table I below.

A displacement of ±0.3 microns in the z-direction from a central position was used for purposes of the FIG. 2 octahedral dopant site comparison with dopants closer to or further away from the germanium-rich region. In a pure silicon lattice, the displacement positions would be equivalent in the bulk.

Similarly, the interactions of dopants at the FIG. 3 tetrahedral positions would be identical in the bulk of a pure silicon lattice.

The FIG. 4 substitutional site S1 is closer to the germanium-rich region than site S2 and, where it is not, the difference in distance between it and site S2 is less than 20%. Again, the environments at S1 and S2 would be identical in the bulk of a pure silicon lattice.

The total energies for the model systems illustrated in FIGS. 2-4 were calculated using a self-consistent charge extended Hückle program described in detail by S. Aronowitz, et al., "Quantum-chemical modelling of smectite clays", Inorg. Chem., 21. 3589-3593 (1982).

Table I presents the calculated difference in energies between configurations where the only change was the proximity of a dopant in a particular site type (such as substitutional) to the germanium-rich region. If the energy difference is positive, i.e., $\Delta E = E_2 - E_1 > 0$, then the configuration $E_1$ is more stable than the configuration $E_2$.

Commonly used n-type dopants, arsenic and phosphorous, along with commonly used p-type dopants, aluminum and boron, were examined.

TABLE I

| Dopant | Relative Energies (eV)[a] | | |
|---|---|---|---|
| | $\Delta E(O_2 - O_1)$[b] | $\Delta E(T_2 - T_1)$[c] | $\Delta E(S_2 - S_1)$[d] |
| Arsenic | +25 | +34 | +46 |
| Phosphorus | +24 | +23 | +18 |
| Aluminum | +16 | +6 | −25 |
| Boron | +18 | +14 | −21 |

[a] A position $P_2$ is more stable than a position $P^1$ if $\Delta E < 0$; otherwise, position $P_1$ is more stable.
[b] Positions $O_1$ and $O_2$ are displayed in FIG. 2. $O_1$ is closer to the germanium cluster.
[c] Positions $T_1$ and $T_2$ are displayed in FIG. 3. $T_1$ is closer to the germanium cluster.
[d] Positions $S_1$ and $S_2$ are displayed in FIG. 4. $S_1$ is closer to most of the germaniums comprising the germanium cluster.

In all cases, when the dopant position species was interstitial (octahedral or tetrahedral), the more stable configuration was the one where the dopant was closer to the germanium-rich region. This uniformity was broken when the dopants were substitutional. In the cases involving substitutional dopants, configurations involving n-type dopants showed greater stability when the dopants were closer to the germanium-rich region, whereas configurations involving p-type dopants showed greater stability when the p-type dopants were in substitutional sites further from the germanium-rich region.

Consequently, n-type dopants in regions with high germanium concentration, whether interstitial or substitutional, tend to remain in those regions; dopant diffusion from such regions is markedly reduced.

This behavior has been observed experimentally for phosphorous.

The "phosphorous" experiment will be described with reference to FIGS. 5A-5E.

Figure 5A:
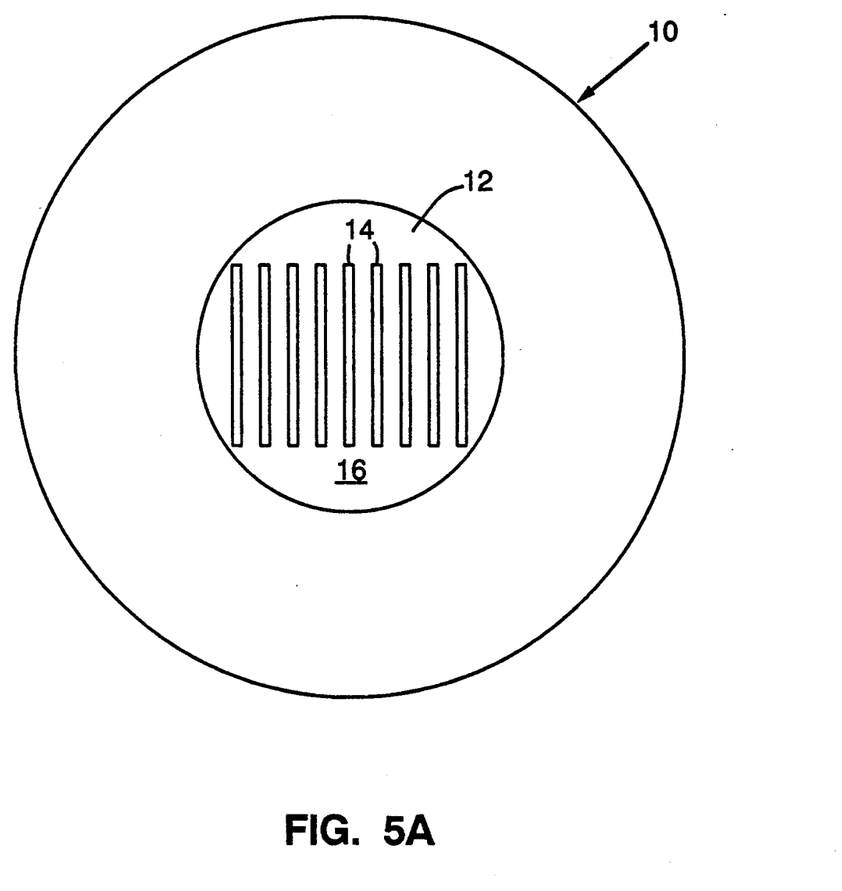
FIG. 5A is a plan view illustrating a crystalline silicon wafer.

FIG. 5A shows a plan view of a crystalline silicon wafer 10. The inner circular area 12 of the wafer 10 consists of dark regions 14 which have been masked by photoresist and light regions 16 which have been left exposed.

Germanium is implanted into the light areas 16 at an implant dosage of $1.5 \times 10^{16}$ Ge/cm$^2$ at an implant energy of 80 keV. The photoresist was then stripped and the wafer was annealed in nitrogen at 1000° C. for 30 minutes to drive the germanium atoms to substitutional sites within the crystalline silicon lattice.

Figure 5B:
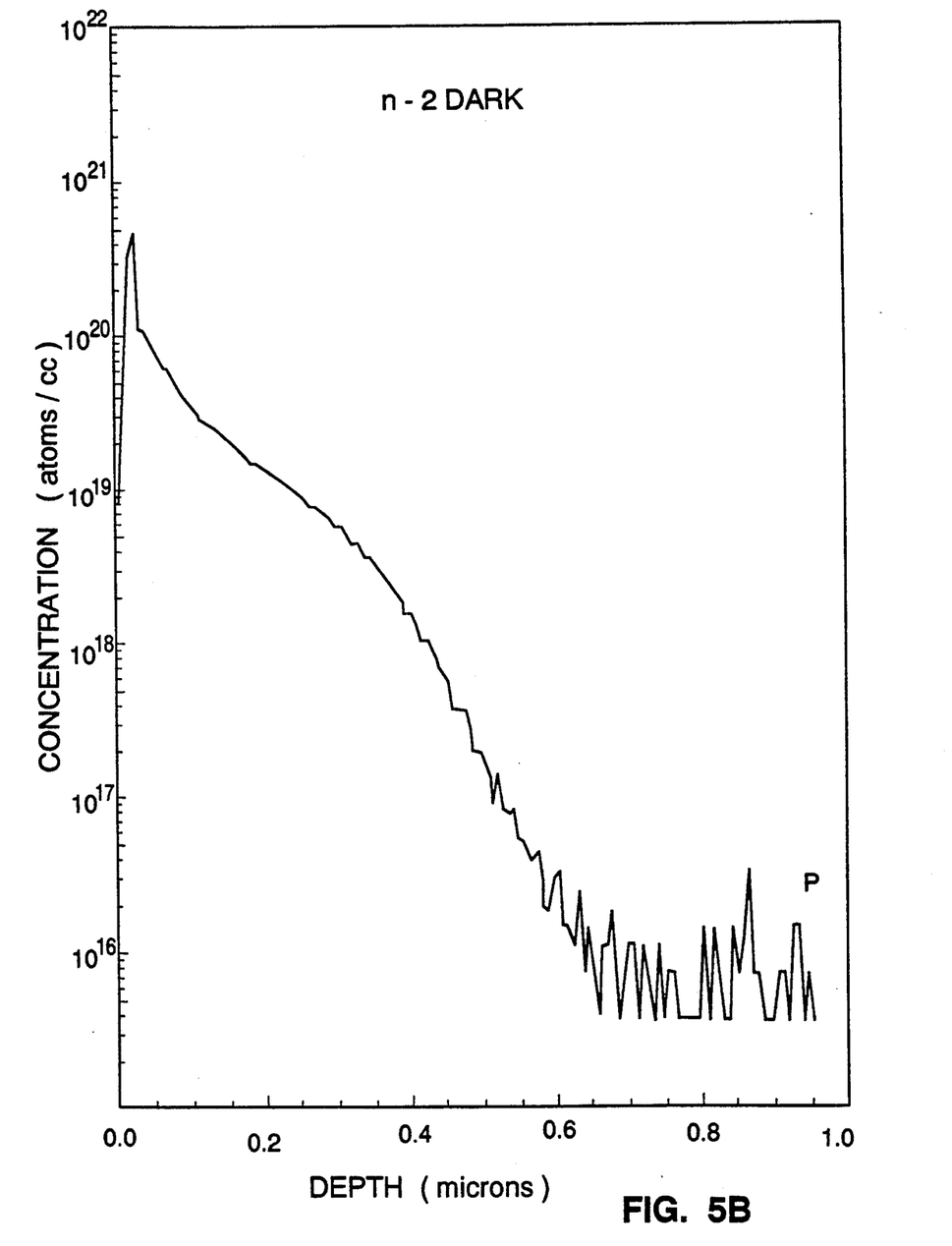
FIG. 5B is a graph illustrating phosphorous concentration versus implant depth in germanium-free areas of the silicon wafer.
Figure 5C:
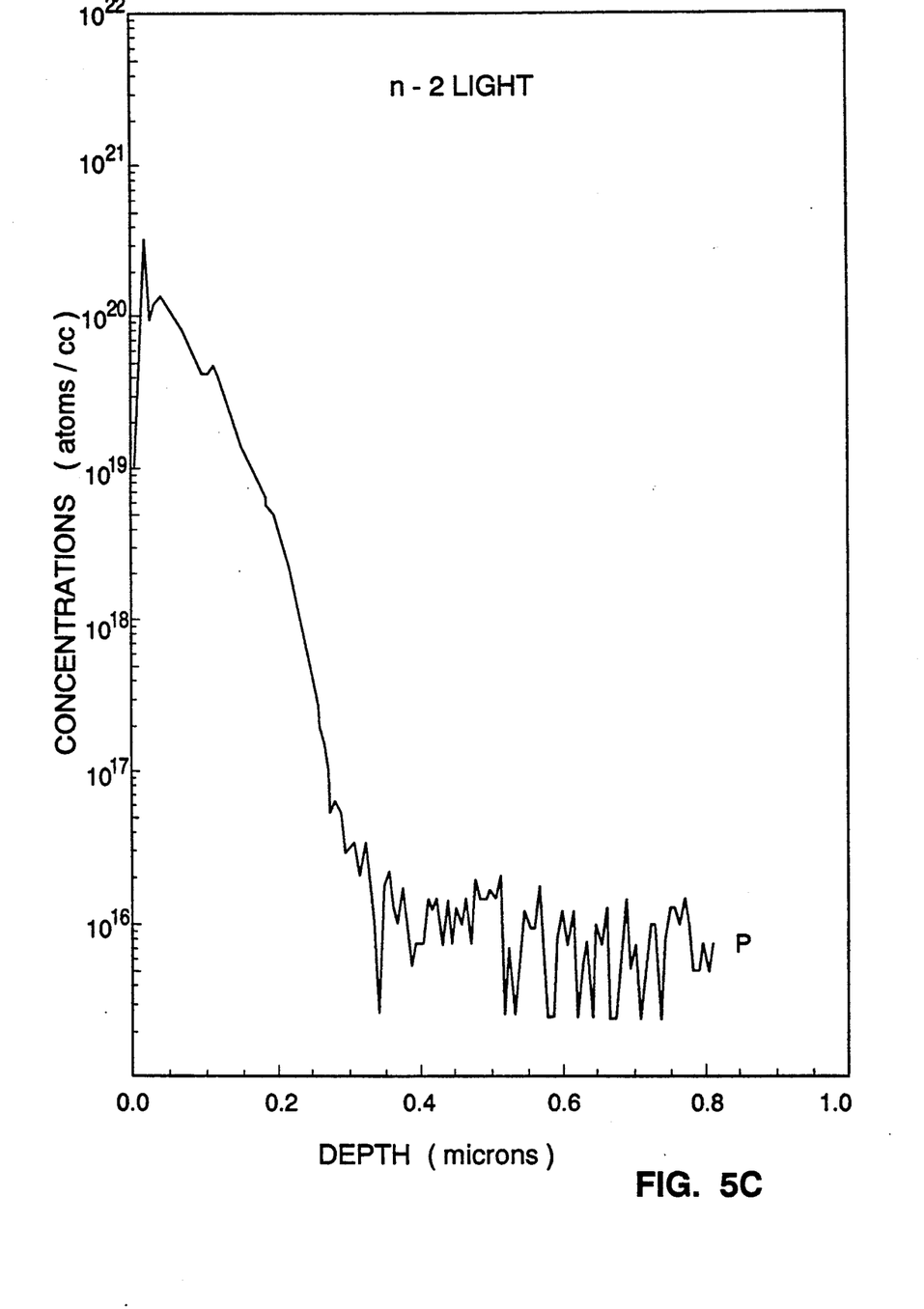
FIG. 5C is a graph illustrating phosphorous concentration versus implant depth in germanium-rich regions of the silicon wafer.
Figure 5D:
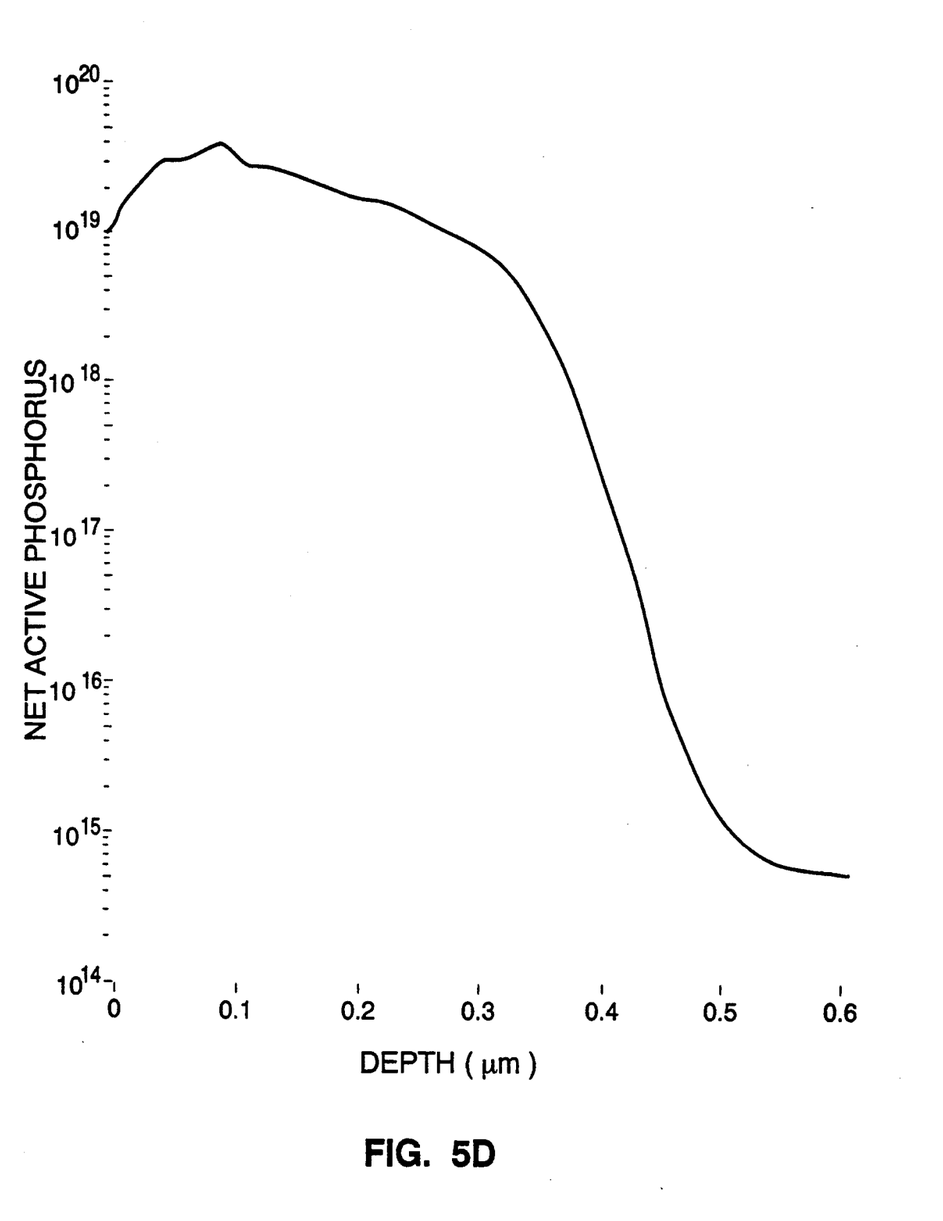
FIG. 5D is a graph illustrating phosphorous diffusion in germanium-free areas of the silicon wafer.
Figure 5E:
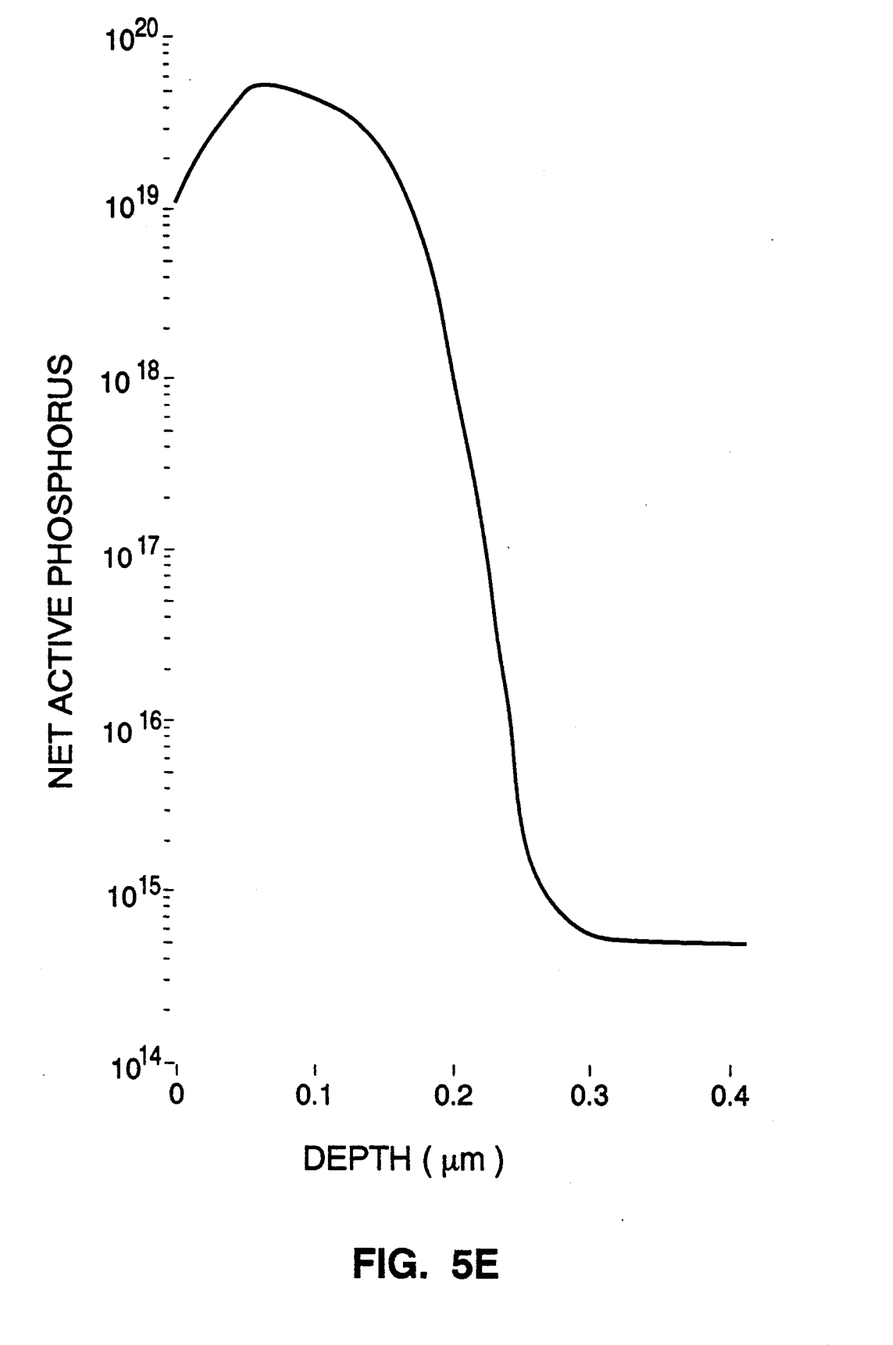
FIG. 5E is a graph illustrating phosphorous diffusion in germanium-rich regions of the silicon wafer.

Following the substitution of the germanium atoms into the silicon lattice, the region 12 was implanted with phosphorous at an implant dosage of $1.5 \times 10^{15}$ P/cm$^2$ and an implant energy of 30 keV. FIG. 5B shows the concentration profile of phosphorous in the germanium-free (dark) areas, that is, those areas that had been masked by photoresist strips 14. FIG. 5C shows the phosphorous profile in the germanium-rich regions 16 of area 12.

Following the phosphorous implant, the wafer 10 was annealed in nitrogen at 900° C. for 30 minutes. A comparison of FIGS. 5D and 5E will show, respectively, that the junction depths for the germanium-free regions are deeper than the junction depth for the germanium-rich regions. These results are consistent with the calculated finding that regions of substitutional germanium will inhibit diffusion of n-type dopants.

The behavior of p-type dopants in regions of high germanium concentration depends on whether the dopants are at interstitial or substitutional sites in the lattice. When interstitial, the diffusion of p-type dopants is significantly reduced; however, upon entering substitutional sites, the p-type dopants exhibit enhanced diffusion from the high concentration germanium region.

The above-described attraction to or repulsion from regions of high substitutional germanium concentration can be used to devise suitable diffusion barriers.

These findings may be applied for p-type dopants by creating two regions in a silicon lattice where germanium in high concentration exists. The germanium-to-silicon ratio in the peak concentration areas of the germanium-rich regions of the silicon lattice should be greater than or equal to Ge:Si=1:5000 and less than Ge:Si=1:10. The results presented in this discussion are based on the ratio of Ge:Si≈1:10.

Figure 6A:
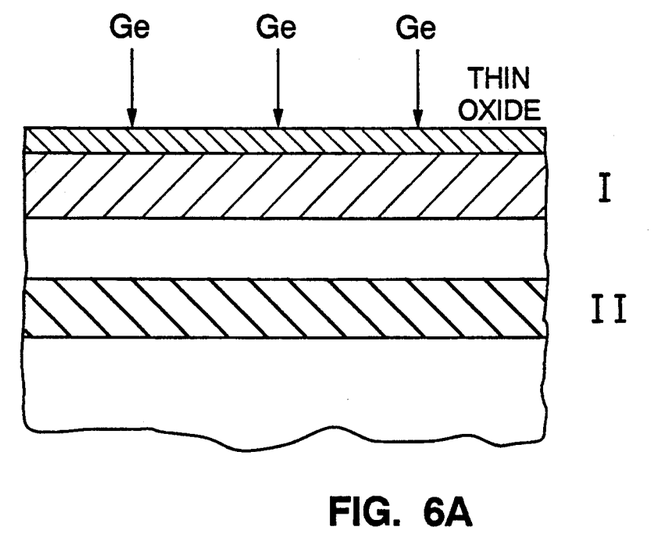
FIGS. 6A and 6B schematically illustrate two applications of germanium barriers in silicon in accordance with the present invention.

FIG. 6A shows the germanium barrier used to control junction depth. Germanium is implanted at two different energies. First, germanium at a dosage of $10^{16}$/cm$^2$ is implanted at low energy (30–80 keV) to provide a first germanium-rich region I. Then, germanium at a dosage of $10^{16}$/cm$^2$ is implanted at high energy ($\geq 180$ keV) to provide a second germanium-rich region II. The lower implant energy is chosen so that the peak concentration of germanium in region I will be at least equal in depth to the peak concentration of the p-type dopant species when it is introduced. The higher implant energy is chosen to produce a distinct second peak in region II that will be the junction boundary. A high temperature anneal follows the double germanium implant to drive the germanium to substitutional sites in the silicon crystal structure and precedes any p-type dopant implant into that region.

Figure 6B:
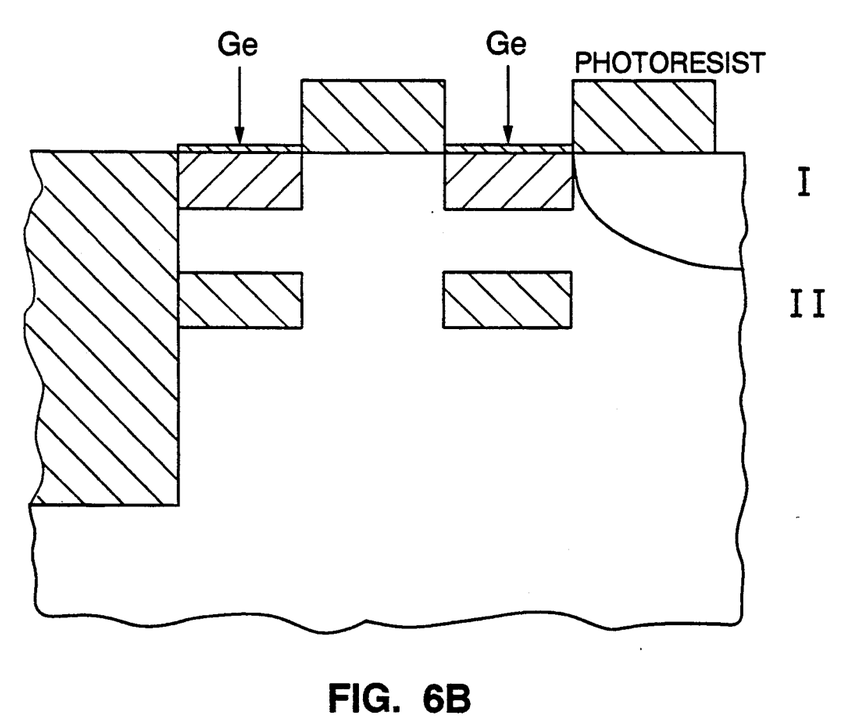

FIG. 6B shows schematically the use of germanium barriers to reduce lateral dopant diffusion into the vicinity of a trench. The two sets of double germanium implants, performed as described above with respect to the FIG. 6A junction depth example, are designed to control both near interfacial lateral diffusion as well as deeper lateral or bulk diffusion to the interface. A high temperature anneal follows implantation of the double germanium sets. The anneal precedes any additional dopant implants into that region. The dotted curve on the right hand side of FIG. 6B represents a future p+region.

Since, as stated above, n-type dopants tend to remain in the germanium-rich regions of the lattice, formation of a single germanium-rich region is sufficient to inhibit n-type dopant diffusion. This region is created by introducing germanium at an implant energy chosen so that the peak concentration of germanium will be at least equal in depth to the peak concentration of the n-type dopant species when it is introduced.

Thus, germanium, when distributed in substitutional sites in silicon so as to form regions of high concentration regions that are interposed between the region where dopants are introduced and the region where these dopants are to be excluded, will act as a diffusion barrier to p-type dopants. In the case of n-type dopants, a single germanium-rich region is sufficient to inhibit diffusion.

In accordance with the present invention, germanium, once implanted into silicon, is annealed to remove damage and to drive the germanium to substitutional sites before an electrically-active dopant species is introduced.

This approach permits formation of very shallow junctions with either n-type or p-type dopants. This is useful for both metal-oxide-semiconductor (MOS) and bipolar devices. It permits sharply defined dopant distributions and channel regions for MOS devices as well as offering isolation barriers with respect to lateral diffusion.

In summary, the specific distribution of germanium in a region of silicon, along with its magnitude (concentration), will have profound effects on other dopant species in that region. As stated above, this has been established experimentally; boron diffusion was altered with changes in the germanium profile and concentration. Consequently, the diffusion pattern of an n-type dopant or a p-type dopant in regions where the germanium distribution is uniform will differ markedly from patterns associated with regions of non-uniform germanium distributions. Differences in diffusion will also arise between variations in the germanium non-uniformity. The effect on other dopant species of specific uniform or non-uniform distributions of germanium, along with effects of varying the quantity of germanium for a given distribution, can now be predicted. Simulations reinforce the conclusion that families of germanium distributions produce families of diffusion patterns for other dopant species.

It should be understood that various alternatives to the embodiments of the invention described herein may be employed in practicing the invention. It is intended that the following claims define the scope of the invention in that structures and methods within the scope of these claims and their equivalents be covered thereby.

What is claimed is:

1. A method of inhibiting diffusion of electrically-active dopant atoms and producing a desired dopant distribution within a silicon lattice using germanium, the dopant distribution defining a junction having a desired profile between the dopant atoms and silicon atoms within the silicon lattice, the method comprising introducing germanium atoms in substitutional sites in the silicon lattice to form a germanium-rich region where the dopant atoms are to be introduced, wherein the germanium distribution profile is such that the location of the introduced germanium atoms substantially defines the desired junction profile within the silicon lattice, whereby the germanium-rich region acts as a diffusion barrier to the dopant atoms, resulting in the formation of the desired dopant distribution and junction profile.

2. A method as in claim 1 wherein germanium atoms are introduced in substitutional sites in the silicon lattice such that germanium-to-silicon ratio in the peak concentration area of the germanium-rich region is in the range of 1:5000 to 1:10.

3. A method as in claim 1 wherein the peak concentration depth of germanium atoms in the germanium-rich region is at least equal in depth to the peak concentration of electrically-active dopant atoms when the dopant atoms are introduced.

4. A method of forming an n-type dopant diffusion barrier in a silicon lattice using germanium to control junction depth and junction profile, the method comprising introducing germanium atoms in substitutional sites in the silicon lattice to form a germanium-rich region where n-type dopant atoms are to be introduced, the location of the introduced germanium atoms substantially defining a desired junction profile within the silicon lattice, whereby the germanium-rich region inhibits diffusion of the n-type dopant atoms and results in the formation of a junction having the desired profile between the dopant atoms and silicon atoms within the silicon lattice.

5. A method as in claim 4 wherein the peak concentration depth of germanium atoms in the germanium-rich region is at least equal in depth to the peak concentration of n-type dopant atoms when the n-type dopant atoms are introduced.

6. A method of forming an n-type dopant diffusion barrier and producing a desired dopant distribution within a silicon lattice using germanium to control lateral diffusion, the dopant distribution defining a junction having a desired profile between the dopant and silicon atoms in the silicon lattice, the method comprising:

(a) implanting germanium atoms into first and second laterally spaced-apart regions of the silicon lattice, the location of the implanted germanium atoms substantially defining the desired junction profile; and (b) prior to introducing n-type dopant atoms into a region of the silicon lattice between the first and second regions, annealing the silicon lattice to distribute the implanted germanium atoms in substitutional sites in the silicon lattice to form first and second germanium-rich regions such that the peak concentration of germanium atoms in the fist and second germanium-rich regions is at least equal in depth to the peak concentration of n-type dopant atoms after the n-type dopant atoms are introduced.

7. A method as in claim 6 wherein the germanium-to-silicon ratio in the peak concentration area of the first and second germanium-rich regions is about 1:10.

8. A method as in claim 6 wherein the germanium-to-silicon using germanium to control junction depth, the method comprising:

(a) implanting germanium atoms into a region of crystalline silicon at a first implant energy;

(b) implanting germanium atoms into the region of crystalline silicon at a second implant energy greater than the first implant energy; and (c) prior to introducing electrically-active dopant atoms into the region, annealing the crystalline silicon to distribute the implanted germanium atoms in substitutional sites in the crystalline silicon to form first and second germanium-rich regions in the crystalline silicon, each of the first and second germanium-rich regions having a selected germanium distribution profile.

9. A method as in claim 8 wherein the germanium dosage for both implants is $10^{16}/cm^2$ and wherein the first implant energy is 30–80 keV and the second implant energy is greater than or equal to 180 keV.

10. A method as in claim 8 Wherein the peak concentration depth of germanium atoms in the first germanium-rich region is at least equal in depth to the peak concentration at electrically-active dopant atoms when the dopant atoms are introduced.

11. A method as in claim 10 wherein the germanium-to-silicon ratio in the peak concentration of the first germanium-rich region is about 1:10.

12. A method of forming a dopant diffusion barrier in silicon using germanium to control lateral dopant diffusion, the method comprising:

(a) implanting germanium atoms into first and second spaced-apart regions in crystalline silicon at a first implant energy;

(b) implanting germanium atoms into the first and second crystalline silicon regions at a second implant energy greater than the first implant energy; and (c) prior to introducing electrically-active dopant atoms into a region of the crystalline silicon between the first and second regions, annealing the crystalline silicon to distribute the implanted germanium atoms in substitutional sites in the crystalline silicon to form two germanium-rich regions interposed between the region where dopant atoms are to be introduced and a region from which dopant is to be excluded, each of the germanium-rich regions having a selected germanium distribution profile.

13. A method as in claim 12 wherein the first implant energy is such that the peak concentration depth of germanium atoms in the germanium-rich regions is at least equal in depth to the peak concentration of dopant atoms when dopant atoms are introduced.

14. A method as in claim 12 wherein the germanium dosage for both implants is $10^{16}/cm^2$ and wherein the first implant energy is 30–80 keV and the second implant energy is greater than or equal to 180 keV.

15. A method as in claim 14 wherein the germanium-to-silicon ratio in the peak concentration area of the first and second germanium-rich regions is about 1:10.

* * * * *

UNITED STATES PATENT AND TRADEMARK OFFICE
CERTIFICATE OF CORRECTION

PATENT NO. : 5,298,435

DATED : March 29, 1994

INVENTOR(S): Sheldon Aronowitz; Courtney L. Hart; and Sung T. Ahn

It is certified that error appears in the above - identified patent and that said Letters Patent is hereby corrected as shown below:

Delete line 34, Column 8, and insert --A method of forming a dopant diffusion barrier in--

Signed and Sealed this

Fifth Day of July, 1994

Attest:

BRUCE LEHMAN

Attesting Officer     Commissioner of Patents and Trademarks